(12) United States Patent
Sahlén et al.

(10) Patent No.: US 6,215,804 B1
(45) Date of Patent: *Apr. 10, 2001

(54) PRODUCING LASER LIGHT OF DIFFERENT WAVELENGTHS

(75) Inventors: Olof Sahlén, Solna (SE); Paul Weber, Overijse (BE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/923,034

(22) Filed: Sep. 3, 1997

(30) Foreign Application Priority Data

Sep. 4, 1996 (SE) .................................... 9603219

(51) Int. Cl.$^7$ ......................................... H01S 5/026
(52) U.S. Cl. ................................. 372/50; 372/8; 372/26
(58) Field of Search .............................. 372/96, 50, 102, 372/45, 23, 8, 26

(56) References Cited

U.S. PATENT DOCUMENTS

| | | | |
|---|---|---|---|
| 4,884,753 | * 12/1989 | Okai et al. ................................ | 372/96 |
| 5,117,469 | 5/1992 | Cheung et al. .......................... | 385/11 |
| 5,119,393 | * 6/1992 | Oka et al. ................................ | 372/96 |
| 5,379,318 | * 1/1995 | Weber ..................................... | 372/96 |
| 5,425,043 | 6/1995 | Holonyak, Jr. et al. ................ | 372/50 |
| 5,586,138 | * 12/1996 | Yokoyama ............................... | 372/96 |
| 5,642,371 | * 6/1997 | Tohyama et al. ....................... | 372/96 |

FOREIGN PATENT DOCUMENTS

| | | | |
|---|---|---|---|
| 0194335 | * 9/1986 | (EP) | ....................................... 372/23 |
| 0 735 635 | 10/1996 | (EP) | . |
| 0255087 | * 11/1996 | (JP) | ....................................... 372/23 |

OTHER PUBLICATIONS

O. Sahlén et al., "Zero–Bias and Low–Chirp, Monolithically Integrated 10 Gbit/s DFB Laser and Electroabsorption Modulator on Semi–insulating InP Substrate", Electronics Letters, Jan. 18, 1996, vol. 32, pp. 120–121.

* cited by examiner

Primary Examiner—James W. Davie
(74) Attorney, Agent, or Firm—Burns, Doane, Swecker & Mathis, L.L.P.

(57) ABSTRACT

In a tunable laser device a plurality of basically identical lasers are arranged adjacent to each other in a line or row on a common substrate. The lasers can be DFB-type and they have different emission wavelengths, obtained from e.g. different pitches of gratings which define the wavelengths of the respective lasers. The lasers can be activated to emit light independently of each other by supplying electrical current to contacts located on the top sides of the lasers. When a laser is activated, the other lasers are biased, so that lasers located at one of side of the active laser will be transparent to the emitted light, which can then travel from the lasers through an electrooptic modulator, and the lasers located at the other side will absorb the light. By controlling the temperature the wavelength of emitted light can be finely adjusted. Such a laser device has a compact structure, is fairly insensitive to variations of the used drive currents and can in simple way be adjusted to different operating conditions and be compensated for aging effects.

8 Claims, 4 Drawing Sheets

PRODUCING LASER LIGHT OF DIFFERENT WAVELENGTHS

The invention relates to a light source for producing or emitting light, the wavelength of which can be controlled such as by means of electrical signals, in particular a laser device which is tunable to emit light of different wavelengths, and also to a method of producing or emitting laser light of different wavelengths.

BACKGROUND

By introducing the use of wavelength division multiplexing (WDM) in optical fiber communication networks the bandwidth of and thereby the transmitted information amount in such networks can be made much higher than before, without using extremely high transmission rates. The information is instead transmitted on a number of parallel channels which each one comprises a definite, separate wavelength region or wavelength band. Systems are is presently introduced comprising 4–16 channels having a transmission rate or bit rate of 2.5 Gbits/s per channel. As regarded in a longer perspective of time, certainly still more channels will be used. Thus, it is completely realistic to use a number of 16–32 channels and in laboratory situations functioning transmission systems using 128 channels have been demonstrated. Further, in the same way, certainly also the bit rate per channel will be significantly increased, for example up to 10 Gbits/s. Still higher transmission rates have been used in laboratory situations such as bit rates of 20, 30 and 40 Gbits/s and they will perhaps also be used in the future.

For each channel and wavelength region in wavelength multiplexed transmission a separate light source such as a suitable semi-conductor laser must be used, the light issued by the laser in addition having to be capable of being modulated in order to obtain a bit stream carrying useful information. However, one of the main problems is to achieve such laser transmitters, since they must have a narrow optical line width, i.e. have a small chirp. It can be accomplished by among other methods introducing external modulation, i.e. that the laser is driven by a constant current, and by making the modulation by means of a separate intensity modulator or an intensity modulator monolithically integrated with the laser, for example of electroabsorption type. The laser should be either type DFB, i.e. a laser having distributed feedback, or of type DBR, i.e. a laser having a distributed Bragg reflector, in order to ensure that when operating the laser only one longitudinal electromagnetic mode lases.

The wavelength region which presently is most interesting for wavelength multiplexing comprises the range of about 1530–1560 nm. This is the range for which good fiber amplifiers are available, such as erbium doped fiber amplifiers (EDFA:s). In the future other wavelength ranges can start to be used such as for example about 1300 nm.

Typically, presently used light emitting and modulating devices are constructed so that laser transmitters of e.g. type DFB are manufactured for different wavelengths, at which the respective laser transmitter can be activated for emitting light. The lasing wavelength of such a DFB laser is determined by the active refractive index in the active layer of the laser and of the pitch ("pitch") of the longitudinal grating, i.e. of the grating period. Such a laser can be tuned by controlling the temperature of the laser within a wavelength interval of about 5 nm, since in the typical case the wavelength varies by about 0.1 nm/K and since semiconductor lasers cannot be operated at too high temperatures due to increasing threshold current and a reduced output power of the emitted light for increasing temperature. It means that lasers have to be manufactured in different wavelength classes and that when installing transmitter equipment for wavelength multiplexing correct components have to be selected. It also means that the emitted wavelength cannot be easily changed within a larger wavelength range, i.e. a change to an arbitrary channel cannot easily be made. Possibly only a change of channels can be made for lasers operated at wavelengths which are close to each other. However, such channel changes can be of interest in flexible optical networks comprising optical cross connections (OXC) and optical multiplexers having an add and drop function (OADM, Optical Add/Drop Multi-plexers).

Different proposals have been presented in order to achieve lasers having a wider range in which the wavelength can be selected. These proposals comprise different variants of DBR lasers, in which the reflection maximum of the grating can be displaced by injecting current or by heating the wave guide locally or by subjecting the device to an electrostatic field. One proposal is based on the method that a DFB laser is divided in different segments and the current is varied in the different segments. A third proposal is based on the method that the laser cavity is divided in different subcavities having somewhat different lengths and interference is used between the different cavities in order to define the wavelength which is to be emitted, so called Y-lasers or $C^3$-lasers. A problem associated with all these types is that the tuning mechanism is relatively complicated such as that it requires complicated control algorithms and that all those types which are based on current injection in order to change the refractive index, potentially suffer from problems associated with the reliability of the devices.

SUMMARY

It is an object of the invention to provide a laser device which can be tuned to provide light of different wavelengths within a not too limited wavelength range.

It is another object of the invention to provide a tunable laser device which has a reliable function and is not too sensitive to the choice of the operating voltages and operating currents.

It is another object of the invention to provide a tunable laser device which has a compact construction and can be built in a monolithically integrated way on a single circuit plate and thus does not require additional optical components in order to operate.

The problem which the invention intends to solve is thus to provide a tunable laser device which has a simple and reliable construction and function and which can easily be controlled to emit light at a selected wavelength within a not too limited wavelength range.

The solution of the problem presented above and also other problems is to provide a number of independent lasers which in principle are identical to each other and are located adjacent to each other in a line or row configuration. The lasers have different emission wavelengths and can be operated to emit light independently of each other. The light emitting directions of all lasers substantially agree with each other, i.e. the lasers have the same longitudinal direction. Further, the arrangement of lasers is such that light emitted from a laser in the row will pass in a direction towards and/or through the other lasers and in particular the laser cavities thereof.

Such a laser device is advantageously constructed by means of semiconductor lasers on the same semiconducting or other type substrate. Compared to a tunable laser arrangement comprising several lasers which emit light in parallel to each other and at the side of each other, in the laser device as described herein an optical coupler is not required which is a significant simplification of prior art devices.

Generally, thus, the laser device as described herein is robust and simple in its construction. It can also easily be controlled since it requires only a relatively simple control algorithm. In the design of a laser device based on semiconductors the emission wavelengths of the laser can be finely adjusted by controlling the temperature of the device in the known way. Further, the device requires a small surface on the substrate common to the lasers since no coupler is required. The manufacture of the laser device can be made by means of the same known process which is used for manufacturing DFB lasers.

Generally, for emitting laser light of one of a plurality of different wavelengths, thus the following steps are executed: first at least two laser units are provided which are adapted to emit light of different emission wavelengths; the laser units are then placed e.g. in a line or row, so that when one thereof is biased for emitting laser light, the light is emitted in directions, generally in two opposite directions, one of which will pass through at least one other laser unit—preferably all laser units are located, so that light emitted from all of the laser units have the same directions; only one, a first one of the laser units is then biased or activated to emit light, such as by providing it with suitable driving electrical voltages and currents; a second, different one of the laser units, through which one of the directions of the light emitted from the first laser unit passes, is biased either to be transparent to the light emitted from the first laser unit, i.e. to let the emitted light through, or to absorb the light emitted from the first laser unit.

The laser units can be divided in second laser units located on one side of the first laser unit and third laser units located on an opposite side of the first laser unit, where possibly such second and third laser units do not exist, depending on the location of the first laser unit in the line or row of the laser units, so that one direction of light emitted from the first laser unit extends through all second laser units and an opposite direction of light emitted from the first laser unit extends through all third lasers. All the second lasers can then be biased to be transparent to the light emitted from the first laser unit and all the third lasers can be biased to absorb the light emitted from the first laser unit. The light emitted in one of the opposite directions from the first laser unit can thus always be absorbed by some suitable means, such as by a specially adapted absorbing unit.

The temperature of the laser units, in particular in the case where they are based on semiconductors, can be controlled to a desired value in order to produce a fine adjustment of the emission wavelengths of the laser units. The light emitted by activating the first laser unit can be modulated in order to carry information bits.

BRIEF DESCRIPTION OF THE DRAWINGS

The invention will now be described in greater detail by way of non limiting embodiments with reference to the accompanying drawings, in which.

DETAILED DESCRIPTION

Figure 1:
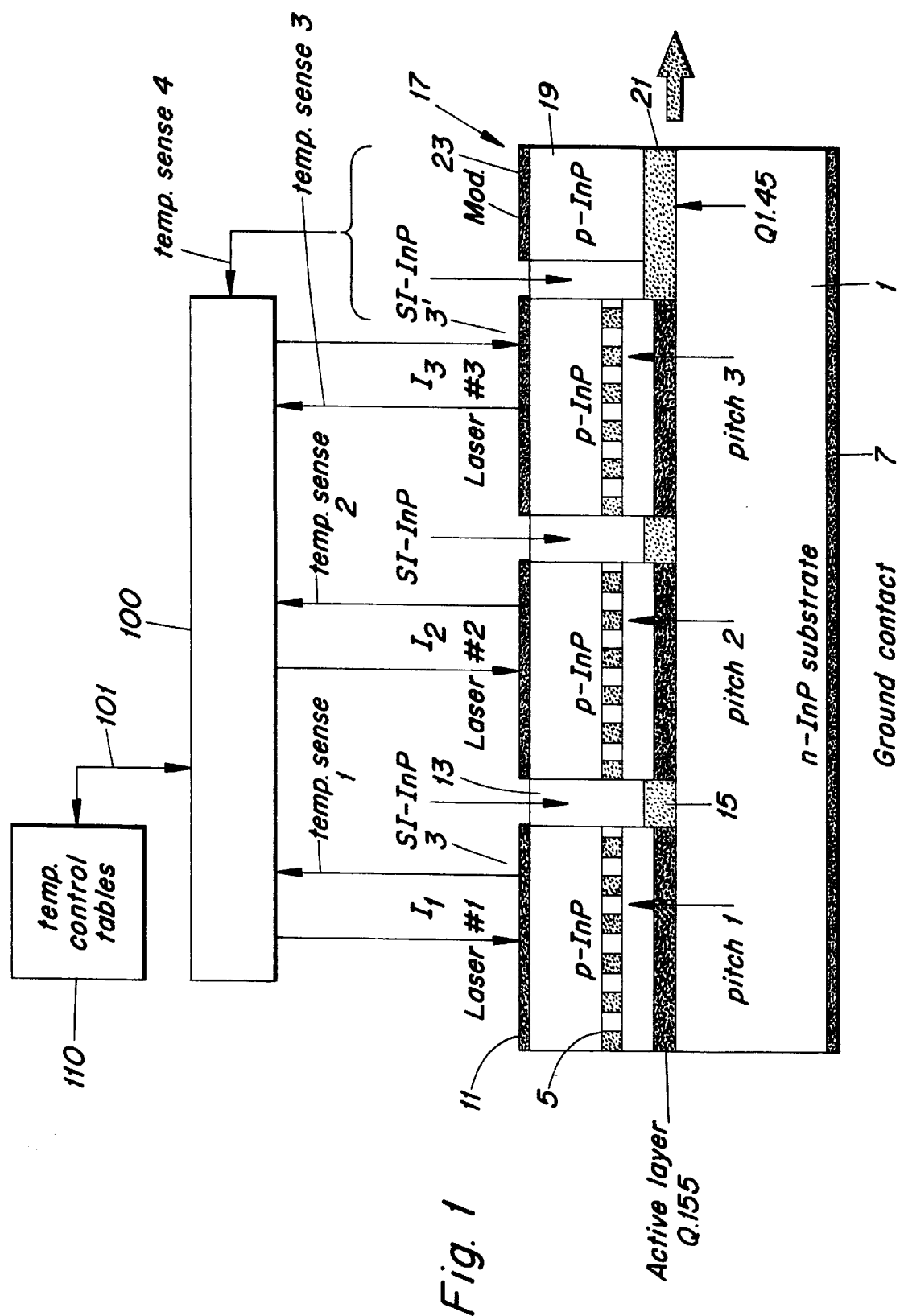
FIG. 1 is a schematic picture of a cross section of a laser device tunable to different wavelengths and comprising three individual lasers and a modulator.

In FIG. 1 a cross section of a tunable laser device is shown which is constructed on a semiconductor plate being an n-doped InP-substrate 1. The laser device comprises a plurality of DFB lasers 3, 3', in the example illustrated three lasers, but in practice at least up to ten individual lasers can be used. The lasers are located in a row and adjacent to each other and are numbered 1, 2, 3 and all have different grating periods of their gratings 5. Each laser 3, 3' is operated basically independently of the other lasers, so that it can be made to emit laser light independently of the other lasers, if a suitable electric current is supplied thereto. The grating periods of the lasers are chosen in a suitable way so that the wavelengths at which the lasers emit-laser light will have a suitable or sufficient difference between each other.

The wavelength separation between the individual lasers 3, 3' and the grating constants thereof, i.e. the coupling strength of the gratings per unit of length, must be selected in such a way that the stop band, which is the spectral region within which the grating reflects light of the laser, does not overlap the stop band of the other lasers. If this condition is not fulfilled, problems can be obtained related to non-desired parasitic reflections. The spectral width $\Delta\lambda$ of the stop band, which also is the optical 3 dB bandwidth of the grating, is given approximately by $$\Delta\lambda = \kappa\lambda^2/\pi n$$

where $\kappa$ is the coupling strength in the grating, $\lambda$ is the wavelength of light in vacuum, and n is the effective refractive index in the waveguide. Typical values for DFB lasers are $\kappa=50$ cm$^{-1}$, which can vary from 10 cm$^{-1}$ to 100 cm$^{-1}$, $\lambda=1.55$ $\mu$m and n=3.25, which gives $\Delta\lambda\approx1.2$ nm. In order to ensure that small reflections due to feedback from gratings located around a considered DFB laser 3, 3' will not interfere with that laser, therefore, for the values given as an example, the distance between the emission wavelengths of the lasers should be at least 2–3 nm, which corresponds to approximately 1.5·$\Delta\lambda$. In the typical case, for maintaining a suitable overlap between those wavelengths which can be obtained by temperature control, see below, the difference between the wavelengths of light emitted from the lasers can however be somewhat increased and can be typically about 3–5 nm.

All the lasers have a common ground contact 7 such as on the underside of the substrate 1. The waveguides 9 in the lasers are manufactured of InGaAsP (bulk material or quantum wells) having a luminescence wavelength of 1550 nm (Q1.55). Above the layers containing the waveguides are the longitudinal gratings 5 arranged. The grating period is determined when manufacturing the semiconductor plate by means of for example electron beam lithography. Each laser 3, 3' has its own electric contact 11 on its top side. The lasers 3, 3' are electrically separated from each other by means of trenches 13 containing for example semi-isolating InP, SI-InP. The lasers 3, 3' are optically connected to each other by means of passive waveguides 15 which are located at the bottoms of the trenches 13 and can be InGaAsP having a luminescence wavelength of about 1450 nm (Q1.45).

Adjacent to a laser 3' at the end of the row of lasers 3, 3' can an optical intensity modulator 17 of electro-absorption type be arranged which comprises a p-doped InP-layer 19. This layer 19 is located on top of a passive waveguide 21 of the same type as those waveguides 15 which connect the lasers 3, 3' to each other. The InP-layer 19 of the intensity modulator has on its top side an electric contact 23 for supplying the modulating electric voltage.

Figure 2:
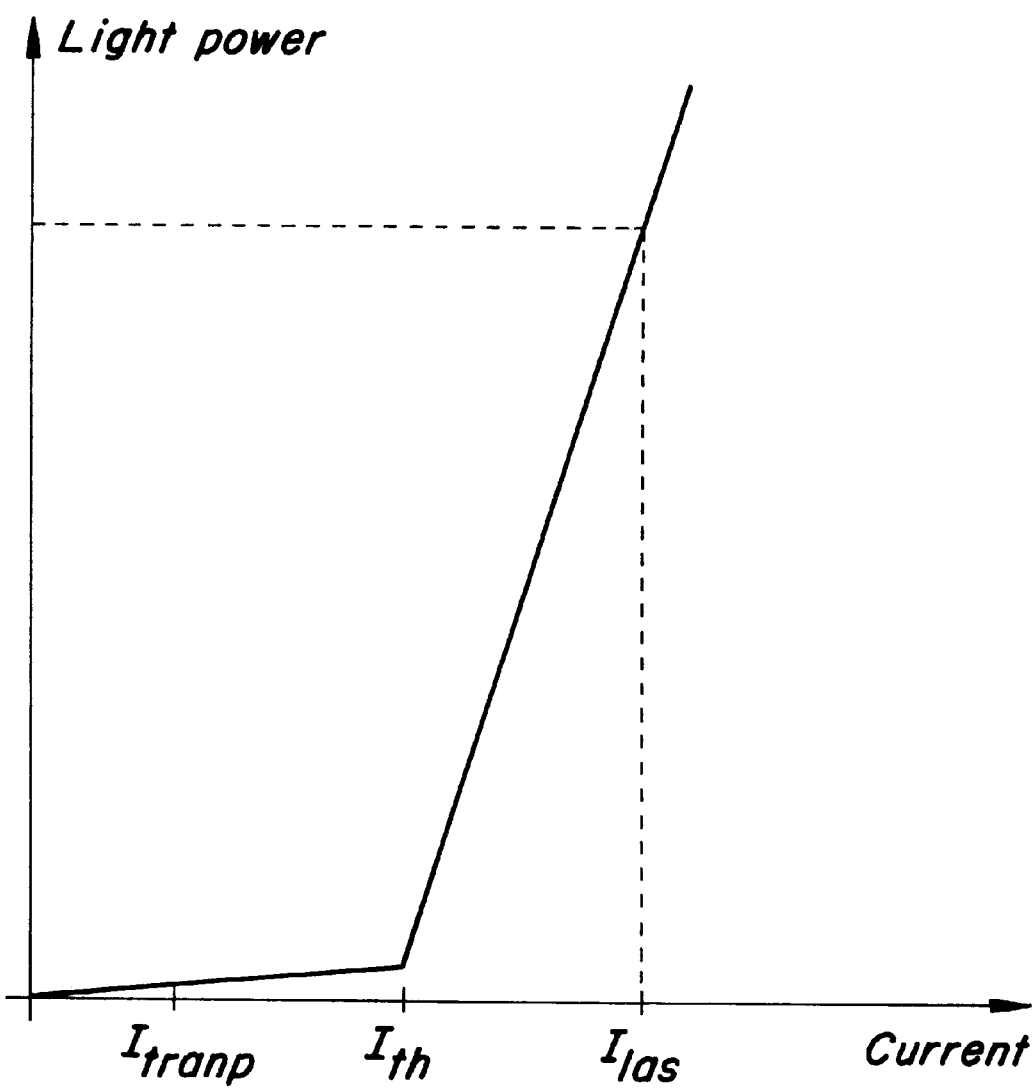
FIG. 2 is a diagram of the power of light output from a DFB laser as a function of the electric current supplied thereto.

The operation of the laser device will now be described in conjunction with the diagram in FIG. 2. The current intensities which are supplied to the lasers 3, 3' are denoted by $I_1$, $I_2$, $I_3$ where the index corresponds to the order number of the lasers. One of the lasers is selected, e.g. laser No. 2, by biasing it forwardly by a large current $I_2 = I_{las}$, which substantially exceeds the threshold current $I_{th}$ and which thus passes through the laser. The laser will then start emitting laser light. This light is emitted in two opposite directions, in the longitudinal direction of the laser, i.e. both in the forward direction, i.e. to the left, towards the modulator 17, and in the backward direction, i.e. to the left, as seen in FIG. 1.

For the simplest type of laser design the ratio of light which is emitted in one direction and light emitted in the opposite direction is equal to one. However, the grating of the laser can be designed so that more light is emitted in one direction than in the opposite one. It is achieved in the known way by varying the strength of the grating in the longitudinal direction (in the same laser).

Those lasers which are located behind the selected laser, in the mentioned example laser No. 1, are operated to be voltage biased in the backward direction or with only a weak biasing in the forward direction so that no electrical current passes through these lasers. The current $I_1$ can thus in the example be negative or have a small positive value. These lasers located behind will then absorb the light which is emitted in the backward direction of the selected laser. Thereby problems are eliminated which are associated with reflections from the rear laser facet in the selected laser, i.e. from the rear side surface of the selected laser as seen in the longitudinal direction. In order to ensure that no reflections influence the rearmost laser—the rearmost laser is laser No. 1 in FIG. 1—if this is selected for emitting light, an extra section, not shown, can be applied to the rearmost portion of the laser device. This section can have a construction identical to that of the lasers of the row but need not be capable of emitting light. This section is given a driving current so that it will be absorbing in the same way as has been described above for those lasers which are located behind an activated laser. Alternatively, at the rearmost portion of the laser device one or several dielectric anti-reflection layers, not shown, can be arranged.

The lasers which are located in front of the selected lasers, is i.e. those which are located between the selected laser and a possible modulator, in the example chosen laser No. 3, are operated moderately biased in the forward direction. Thereby is meant that the voltage over these lasers in the typical case is selected so that the current has a value between the transparency current $I_{tranp}$ and the threshold current $I_{th}$, see FIG. 2. In the example $I_{tranp} < I_3 < I_{th}$ thus should be true. The transparency current $I^{tranp}$ is defined as that current intensity at which an incoming light signal experiences neither a net amplification or a net absorption in the active layer of the laser. The threshold current $I_{th}$ is defined as that current intensity at which the stimulated amplification balances the total losses produced by both absorption and coupling of light away from the laser cavity and is thus the current at which a laser starts to emit laser light, i.e. starts to "lase", when increasing the current through the laser.

The choice of the exact value of the current intensity for the lasers located in front of the selected laser is not particularly critical, since the interval between the transparency current $I_{tranp}$ and threshold current $I_{th}$ typically comprises several mA. The exact choice of operating current determines the level of the output power. Typically, the output power can be varied by a few dB depending on the position of the current intensity of these lasers within the interval $[I_{tranp}, I_{th}]$.

All of said three current intensities $I_{las}$, $I_{th}$ and $I_{tranp}$ are rather strongly dependent of temperature. Generally therefore, when using semiconductor laser devices correct values must be selected. In an automatically operating device the lasers can then be controlled by means of some controlling means such as a microprocessor 100, in the memory 110 of which tables are stored for the temperature dependency of these quantities. The control means must then also comprise some temperature sensor, such as temperature sensors 1, 2, 3 and 4 which may be of a construction known in the art, and produce a signal readable by microprocessor 100 and then selects, as guided by the measured temperature and table values and as commanded by suitable control signals, the correct operating currents to the lasers included in the laser device in order to activate the desired laser so that its light is emitted in the intended way. To provide such a control means results in no substantial complication compared to presently used systems having a similar function. Each construction of a wavelength tunable light source based on semiconductors thus requires some form of logical control mechanism.

If the driving current of a laser located in front, i.e. laser No. 3 in the example, has a too small value, light will be absorbed therein and the total output power of the laser device decreases. It can be automatically detected by means of some suitable photo detector, not shown, which can be arranged after the modulator and is coupled to the control means. Alternatively, the modulator 17 can itself be used as a photo detector, since the light absorbed therein causes a photo current. By measuring this photo current one also measures the amount of light which passes through the modulator. For compensating such decrease the operating current of those lasers which are to be transparent can be increased or the current through the active laser can be increased. However, there is no problem associated with the laser making non-desired node jumps or getting instable, which is the case if unsuitable currents are selected in a laser which bases its tuning mechanism on changes of the refractive index as induced by the supplied electric current, such as DBR lasers and similar ones. When a laser ages, also the optimal operating currents will be changed, usually increase. This can with the construction described above easily be compensated in the indicated way, whereas in lasers of types similar to the DBR laser a more complicated monitoring is required in order to ensure that the laser device will not come in an operating state having unsuitable or incorrect current values, which for example can result in a bad side mode suppression of the laser.

A fine adjustment of the wavelength of laser light emitted from the device described above can be achieved by changing the temperature of the whole circuit plate, e.g. by arranging a Peltier element, not shown, in a capsule accommodating the laser device. If one wants to be able to tune the laser device to an arbitrary wavelength within a certain wavelength interval, thus, the number of lasers and the differences between the grating periods thereof should be selected so that the possible temperature changes, for example within an interval from about 0° C. to about 50° C., is sufficient therefor.

The laser device can in principle be manufactured in the same way as used when manufacturing DFB lasers, see e.g. the article "Zero-bias and low-chirp, monolithically integrated 10 Gb/s DFB laser and electroabsorption modulator on semi-insulating InP substrate", O. Sahlén, L. Lundqvist, S. Funke, Electron. Lett., Vol. 32, No. 2, pp. 120–121, 1996, which is incorporated by reference herein. An InP-substrate (a semi-isolating InP-substrate or an n-doped InP-substrate can be chosen) can be used according to the above and different alloys of InGaAsP and possibly InAlGaAs for building the structure according to FIG. 1. The different layers can be grown epitaxially by means of MOVPE, Metal Organic Vapor Phase Epitaxy, or some variant thereof, or alternatively some variant of MBE, Molecular Beam Epitaxy. The device can be produced for use in the usual wavelength band of about 1550–1560 nm or by changing the material composition or the alloy contents in the InGaAsP-layers, to other wavelength ranges, for example to the wavelength interval around 1300 nm. Still smaller wavelengths, for example in the wavelength interval about 980 nm, can be achieved by using other material combinations such as the InGaAs/GaAs/AlGaAs-system. Naturally, it is conceivable to also use other material systems than semi-conductors, such as for example doped dielectric materials, e.g. erbium doped quartz-on-silicon, or doped ferroelectric materials, such as erbium doped lithium niobate.

Figure 3:
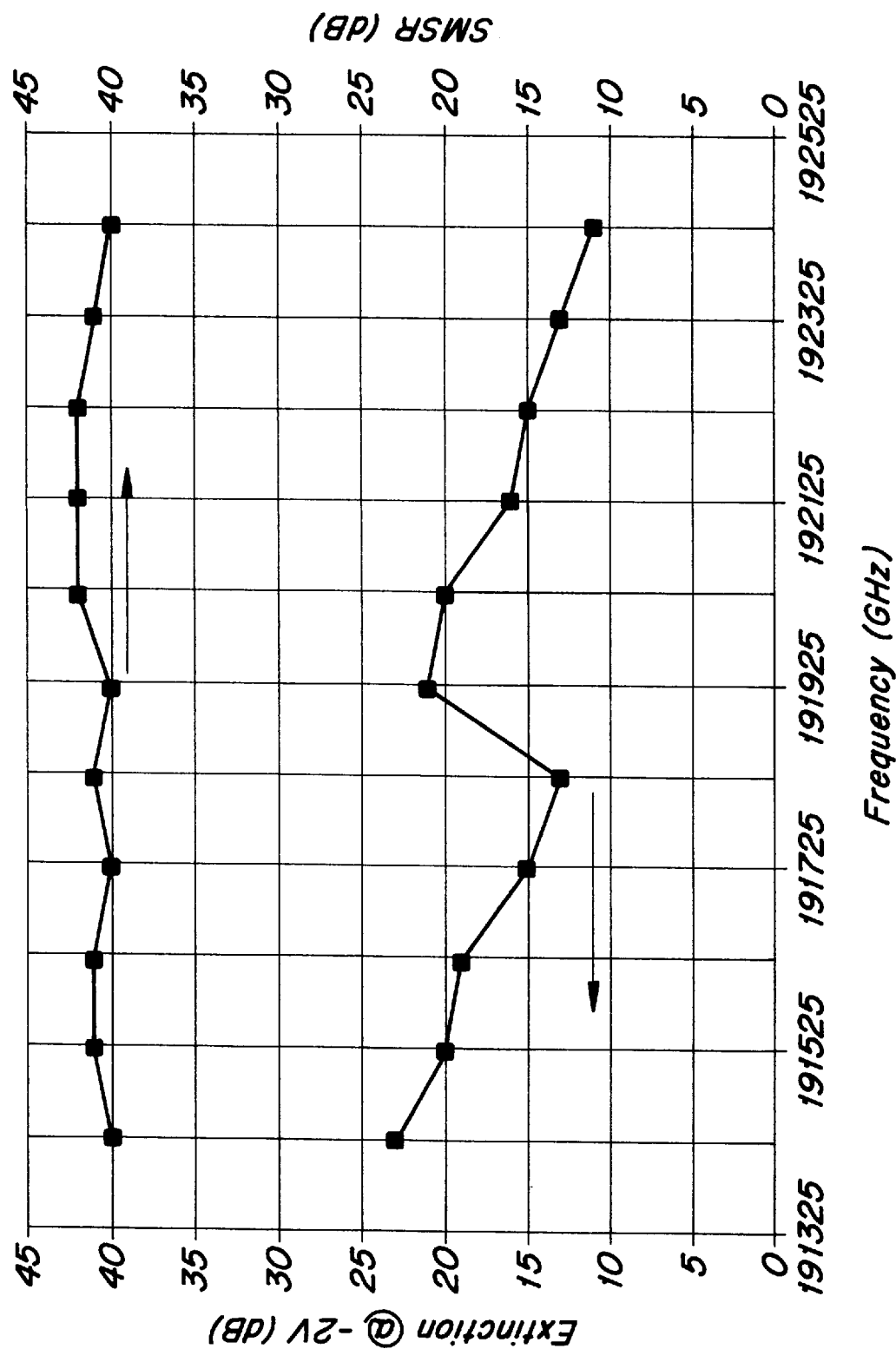
FIG. 3 is a diagram of extinction ratio and side mode suppression as a function of frequency for a laser device containing two individual lasers.
Figure 4:
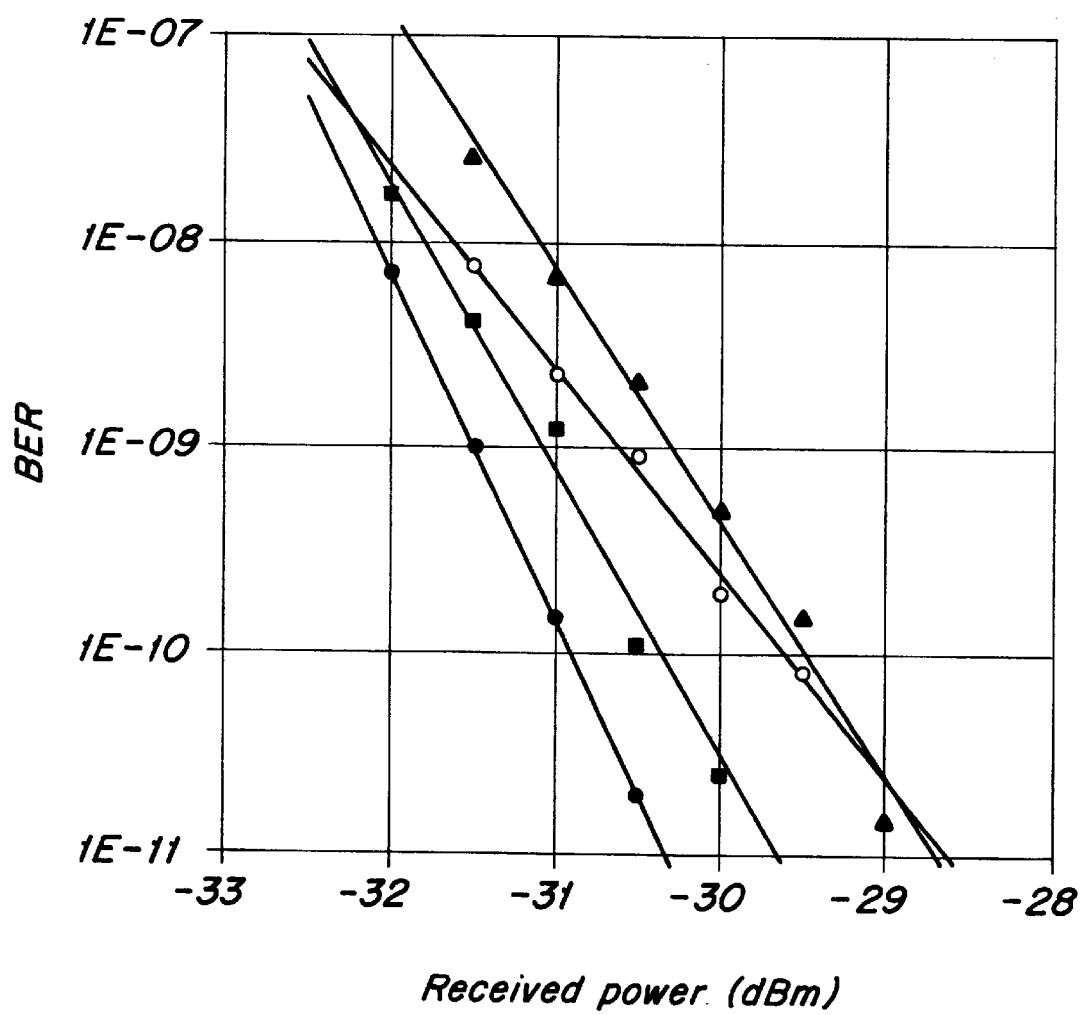
FIG. 4 is a diagram of bit error rate for transmission of information in an optical fiber by means of a laser device containing two individual lasers.

A laser device according to the above has been manufactured comprising two cascaded DFB lasers which had a length of 400 $\mu$m and had a shift of a quarter of a wavelength and a Franz-Keldysh (FK) modulator. The device was manufactured as described in the article mentioned above comprising electron beam lithography for defining the gratings, however with the exception that the active layers now comprise six quantum wells, "strained quantum wells". By adjusting the temperature each one of 11 wavelength channels can be selected, which had a frequency difference of 100 GHz, i.e. a tuning interval of more than 8 nm was obtained, compare the curves in the diagram in FIG. 3. The side mode suppression ration SMSR was better than 40 dB and the modular extinction ratio was larger than 11 dB for all temperatures, when the modulator was supplied with a voltage of 0 to −2 V. The temperature was varied within an interval of 277–324 K. The maximum current used did not exceed 100 mA, which produced a power output of the circuit plate exceeding 1 mW for all operating states. A typical power of the emitted light was 3 mW. The electrooptical small signal response of the modulator was 16 GHz. The laser device was tested in a system having a bit rate of 2.488 Gbits/s (corresponding to STM-16) for a length of 543 km of optical, not dispersion shifted standard fibers. In the diagram of FIG. 4 curves are drawn for the bit error rate BER for four different channels. Two of the curves correspond to the case where the laser located closest to the modulator is activated whereas the two other ones correspond to the case where the rear laser is activated and the front laser is weakly forwardly biased. The modulation had a peak-to-peak value of 2 V in all these cases.

What is claimed is:

1. A method of emitting laser light having one of a plurality of different wavelengths, comprising the steps of:
   providing at least two laser units,
   each one of the at least two laser units adapted to be activated to emit light in emission directions and of different emission wavelengths and adapted to be biased to be transparent to light emitted from at least one other of the at least two laser units and to be biased to absorb light emitted from the at least one other of the at least two laser units in the at least two laser units,
   locating the at least two laser units in relation to each other, so that when one of the at least two laser units is activated for emitting light, the light is emitted in a direction passing through at least a another one of the at least two laser units,
   activating only a first one of the at least two laser units to emit light,
   biasing a second one of the at least two laser units, the second one being different from the first one, a direction of the light emitted from the first one passing through the second one, the baising causing the second one either to be transparent to the light emitted from the first one or to absorb the light emitted from the first one of the at least two laser units.

2. The method of claim 1, further comprising the step of biasing all of the other of the at least two laser units to be transparent to the light emitted from the activated first one of the at least two laser units.

3. The method of claim 1, further comprising the step of biasing all of the other of the at least two laser units to absorb the light emitted from the activated first one of the at least two laser units.

4. The method of claim 1, wherein the step of locating the at least two laser units in relation to each other further comprises locating the at least two laser units in such a way that light emitted from all of the at least two laser units has the same direction.

5. The method of claim 1, wherein the step of locating the at least two laser units in relation to each other further comprises locating the at least two laser units adjacent to each other in a row.

6. The method of claim 1, further comprising the step of absorbing light emitted in one direction from the first one of the at least two laser units.

7. The method of claim 1, further comprising the step of controlling the temperatures of the at least two laser units to desired values in order to produce a fine adjustment of the emission wavelengths of the at least two laser units.

8. The method of claim 1, further comprising the step of modulating light emitted from the first one of the at least two laser units.

* * * * *